United States Patent
Wolf et al.

(10) Patent No.: US 6,713,816 B1
(45) Date of Patent: Mar. 30, 2004

(54) ELECTROSTATIC DISCHARGE DEVICE FOR INTEGRATED CIRCUITS

(75) Inventors: Heinrich Wolf, Unterschleissheim (DE); Wolfgang Wilkening, Pfullingen (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 09/529,942

(22) PCT Filed: Sep. 16, 1998

(86) PCT No.: PCT/EP98/05896

§ 371 (c)(1),
(2), (4) Date: Jun. 27, 2000

(87) PCT Pub. No.: WO99/21229

PCT Pub. Date: Apr. 29, 1999

(30) Foreign Application Priority Data

Oct. 21, 1997 (DE) .......................... 197 45 410

(51) Int. Cl.⁷ .......................... H01L 23/62; H01L 29/76
(52) U.S. Cl. .......................... 257/355; 257/361; 257/362
(58) Field of Search ................ 257/355, 361, 257/362

(56) References Cited

U.S. PATENT DOCUMENTS

| | | | | |
|---|---|---|---|---|
| 5,012,317 A | * | 4/1991 | Rountre .................. 357/38 |
| 5,268,588 A | * | 12/1993 | Marum .................. 257/362 |
| 5,276,350 A | | 1/1994 | Merrill et al. .......... 257/603 |
| 5,341,005 A | * | 8/1994 | Canclini .................. 257/173 |
| 5,343,053 A | * | 8/1994 | Avery .................... 257/173 |
| 5,471,082 A | | 11/1995 | Maeda .................. 257/362 |
| 5,521,783 A | | 5/1996 | Wolfe et al. .............. 361/56 |
| 5,528,064 A | * | 6/1996 | Thiel et al. ............. 257/362 |
| 5,607,867 A | | 3/1997 | Amerasekera et al. ..... 437/31 |
| 5,736,779 A | * | 4/1998 | Kobayashi ............... 257/603 |
| 5,789,785 A | * | 8/1998 | Ravanelli et al. ........ 257/361 |
| 5,889,309 A | * | 3/1999 | Yu et al. ................ 257/363 |
| 6,051,457 A | * | 4/2000 | Ito ...................... 438/208 |

FOREIGN PATENT DOCUMENTS

| | | | | |
|---|---|---|---|---|
| DE | 69311001 | 1/1998 | ......... H01L/23/60 |
| DE | 693 11 001 T2 | 1/1998 | ......... H01L/23/60 |
| GB | 2 288 064 A | 10/1995 | ......... H01L/27/04 |
| JP | 56 48167 | 5/1981 | ......... H01L/27/06 |
| JP | 07029820 | 1/1995 | ......... H01L/21/06 |
| WO | WO95/17007 | 6/1995 | ......... H01H/33/24 |

* cited by examiner

*Primary Examiner*—Jerome Jackson
*Assistant Examiner*—Joseph Nguyen
(74) *Attorney, Agent, or Firm*—Glenn Patent Group; Michael A. Glenn

(57) ABSTRACT

An ESD protection device for an integrated circuit, which is integrated in a semiconductor substrate of the integrated circuit, has a heavily doped p-region provided with a first connection electrode, a heavily doped n-region provided with a second connection electrode, a lightly doped p-region bordering on the heavily doped p-region, and a lightly doped n-region bordering on the heavily doped n-region and the lightly doped p-region in such a way that the lightly doped regions are arranged at least between the heavily doped regions. The distance which exists between the lightly doped p-region and the heavily doped n-region and which is determined by the lightly doped n-region is dimensioned in such a way that the depletion zone in the lightly doped n-region, which becomes larger as the blocking voltage applied to the connection electrodes increases, reaches the heavily doped n-region before the breakthrough voltage between the lightly doped n-region and the lightly doped p-region has been reached.

4 Claims, 1 Drawing Sheet

ELECTROSTATIC DISCHARGE DEVICE FOR INTEGRATED CIRCUITS

The present invention relates to an ESD protection device for electronic devices protecting against electrostatic discharges, so-called ESD protection devices, and in particular to such ESD protection devices for integrated circuits (ICs; IC=Integrated Circuit).

For providing an ESD protection for integrated circuits it is, for example, known to use transistors whose drain electrode and gate electrode are actively clamped by means of Zener diodes. Such known ESD protection devices require, however, much space and entail therefore high costs.

DE 693 11 001 T2 discloses a diode structure for protecting IC terminals, which comprises two diodes, one of these diodes being connected between a ground potential and the connection between a connection surface of the IC and the IC to be protected. The second diode is connected between a supply voltage potential and the above-mentioned connection. The two diodes are respectively connected with different polarities so that the first diode is poled for negative voltages in the direction of flow, whereas the second diode is poled for positive voltages in the direction of flow. The respective diodes are conventional pn-diodes with a lightly doped pn-junction, the connection regions of the pn-diodes being heavily doped.

U.S. Pat. No. 5,521,783 refers to a two-stage circuit used for protecting against electrostatic discharges, the first stage being defined by a transistor with a high breakthrough voltage, whereas the second stage is defined by a transistor with a low breakthrough voltage.

It is the object of the present invention to provide an ESD protection device for integrated circuits, which requires less space and which is therefore less expensive.

This object is achieved by an ESD protection device for integrated circuits according to claims 1 and 5.

The present invention provides an ESD protection device for an integrated circuit, which is integrated in a semiconductor substrate of the integrated circuit. The protection device comprises a heavily doped region of a first doping type, which is provided with a first connection electrode as well as a heavily doped region of a second doping type, which is provided with a second connection electrode. A lightly doped region of a first doping type borders on the heavily doped region of the first doping type, whereas a lightly doped region of the second doping type borders on the heavily doped region of the second doping type and the lightly doped region of the first doping type in such a way that the lightly doped regions are arranged at least between the heavily doped regions. The distance which exists between the lightly doped region of the first doping type and the heavily doped region of the second doping type and which is determined by the lightly doped region of the second doping type is now dimensioned such that the depletion zone in the lightly doped region of the second doping type, which becomes larger as the blocking voltage applied to the connection electrodes increases, reaches the heavily doped region of the second doping type before the breakthrough voltage between the lightly doped region of the second doping type and the lightly doped region of the first doping type has been reached.

According to the present invention, it is of no importance whether the first doping type is a p-doping and the second doping type an n-doping or vice versa.

In the case of one embodiment of the present invention, a heavily doped region of the second doping type is provided in the lightly doped region of the first doping type between the lightly doped region of the second doping type and the heavily doped region of the first doping type, the heavily doped region of the second doping type being connected to the heavily doped region of the first doping type via the second connection electrode. The lightly doped region of the first doping type is preferably implemented as a well around the heavily doped region of the first doping type, the lightly doped region of the second doping type surrounding the well. The lightly doped region of the second doping type can be surrounded by a buried, heavily doped layer of the second doping type.

The present invention provides a device for protecting integrated circuits against electrostatic discharges (ESD) on an integrated circuit. By integrating the ESD protection device in the semiconductor substrate of the integrated circuit, an area-saving ESD protection can be achieved especially at connection points with high operating voltages exceeding e.g. 35 volts in mixed processes. It follows that the present invention provides a substantial reduction of costs in the case of integrated circuits of the type used e.g. in automobiles.

In the following preferred embodiments of the present invention will be explained in detail with reference to the drawings enclosed, in which.

Figure 1:
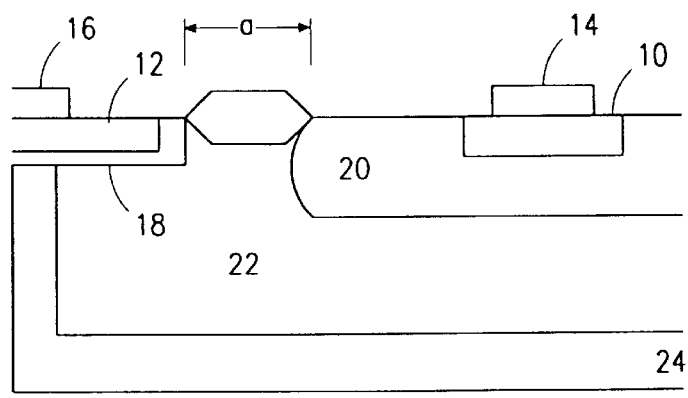
FIG. 1 shows a schematic cross-sectional view of a first embodiment of an ESD protection device according to the present invention.

The explanation of the present application carried out hereinbelow with reference to the drawings is given with regard to the respective types of doping shown in the drawings; it is, however, apparent that the respective dopings can also be inverse, the respective voltages being then inverse as well.

FIG. 1 shows a first embodiment of a laterally adjustable breakdown structure for ESD protection of integrated circuits (ICs). In a semiconductor substrate a heavily doped p$^+$-region 10 and a heavily doped n$^+$-region 12 are provided. The heavily doped p$^+$-region 10 has an electrode 14 applied thereto, which can be referred to as anode, whereas the heavily doped n$^+$-region 12 has an electrode 16 applied thereto, which can be referred to as cathode. In FIG. 1 it can be seen that, in the embodiment shown, the heavily doped region 12 is surrounded by an n-region 18 which is heavily doped as well. The heavily doped p$^+$-region 10 is surrounded by a lightly doped p-well 20. The p-well 20 is, in turn, surrounded by a lightly doped n-region 22 in such a way that a lightly doped n-region is provided between the p-well 20 and the heavily doped n-region 18. This above-described lateral sequence of differently doped semiconductor regions is shown in FIG. 1. The doping of the lightly doped p-region can be in a volume of typically $10^{17}/cm^3$, whereas the doping of the lightly doped n-region 22 is in a volume of typically $10^{15}/cm^3$. The doping of the heavily doped n-region 18 is in a volume of typically $10^{19}/cm^3$.

For the use of such a device as an ESD protection the blocking polarity of the pn-junction between the lightly doped p-region 20 and the lightly doped n-region 22 is relevant. According to the present invention, the distance between the lightly doped p-region 20 and the heavily doped n-region 18, which is designated by a in FIG. 1, is dimensioned such that the depletion zone in the lightly doped n-region 22, which becomes larger as the blocking voltage increases, reaches the heavily doped n-region 18 before the process-dependent breakdown voltage between the lightly doped p-region 20 and the lightly doped n-region 22 has been reached. It follows that, in the case of the structure according to the present invention, the breakthrough between regions 20 and 18 will take place at voltages which are lower than the voltages at which the process-dependent breakthrough between regions 20 and 22 takes place.

The breakthrough voltage for the breakthrough between the lightly doped p-region 20 and the heavily doped n-region 18 of the above structure, which represents an avalanche breakthrough, is adjustable in the layout to voltages below the disruptive strength of the process via the parameter a, i.e. the above-mentioned distance. It follows that this structure is fundamentally suitable to be used as an ESD protection.

As can be seen in FIG. 1, the lightly doped n-region 22 is preferably surrounded by a buried heavily doped $n^+$-region 24 which is connected to the heavily doped n-region 18. Reference should be made to the fact that the heavily doped n-region 18 in FIG. 1 is optional. If the heavily doped n-region 18 does not exist, the breakthrough voltage can be adjusted by adjusting the distance between the heavily doped $n^+$-region 12 and the lightly doped p-region 20.

Figure 2:
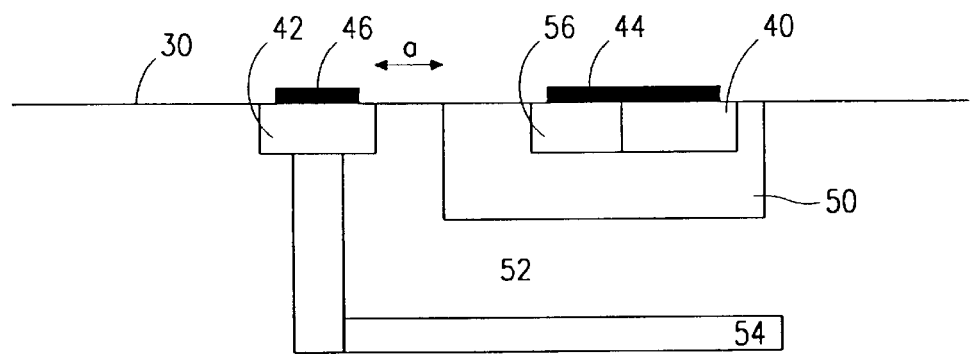
FIG. 2 shows a schematic cross-sectional view of a second embodiment of an ESD protection device according to the present invention.

FIG. 2 shows a cross-sectional view of a further embodiment of the present invention. A heavily doped $p^+$-region 40 and a heavily doped $n^+$-region 42 are again provided in a semiconductor substrate 30. These regions have again applied thereto electrodes 44 and 46. The heavily doped $p^+$-region 40 is surrounded by a lightly doped p-well 50. This well 50 is, in turn, surrounded by a lightly doped n-region 52 which is, in turn, surrounded by a buried heavily doped $n^+$-region 54. In contrast to the embodiment shown in FIG. 1, a heavily doped $n^+$-region 56 is, however, additionally provided in the p-well, the heavily doped $n^+$-region 56 being connected to the heavily doped $p^+$-region 40 via the electrode 44. The structure shown in FIG. 2 can be regarded as a transistor whose collector electrode is defined by electrode 46, whereas the emitter electrode and the base electrode are short-circuited and realized by electrode 44.

Figure 3:
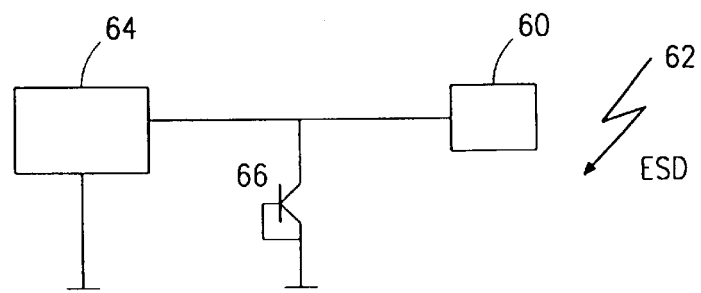
FIG. 3 shows a schematic representation which shows the use of the ESD protection device according to the present invention.

In the embodiment shown in FIG. 2, the well can be charged by the adjustable breakthrough on the collector side, the breakthrough voltage being again adjustable by adjusting the distance a; the vertical transistor can then ignite. A very low-ohmic behaviour and a very high ESD resistance are achieved in this way FIG. 3 shows a block diagram for illustrating how the ESD protection device according to the present invention can be used. Near 60 an input/output connection surface of an integrated circuit is shown, which may perhaps be exposed to an electrostatic discharge 62. The input/out surface is connected to an integrated circuit 64 which is to be protected. As can be seen in FIG. 3, the ESD protection element 66 according to the present invention is connected to ground between the connection surface 60 and the circuit 64 so as to limit the voltage occurring.

What is claimed is:

1. An ESD protection device for an integrated circuit which is integrated in a semiconductor substrate of said integrated circuit, comprising:

a heavily doped p-region provided with a first connection electrode;

a heavily doped n-region provided with a second connection electrode;

a lightly doped p-region bordering on said heavily doped p-region;

a lightly doped n-region bordering on said heavily doped n-region and said lightly doped p-region and having a first portion and a second portion; and a heavily doped n-layer;

wherein said heavily doped n-region, said first portion of said lightly doped n-region and said lightly doped p-region form a lateral sequence of differently doped semiconductor regions adjacent a surface of said substrate;

wherein said lightly doped p-region, said second portion of said lightly doped n-region and said heavily doped n-layer form a vertical sequence of differently doped semiconductor regions;

wherein a lateral distance which exists between said lightly doped p-region and said heavily doped n-region and which is determined by said first portion of said lightly doped n-region is adjusted to be less than a distance which exists between said lightly doped p-region and said heavily doped n-layer and which is determined by said second portion of said lightly doped n-region such that a lateral breakthrough occurs between said lightly doped p-region and said heavily doped n-region before a vertical breakthrough occurs between said lightly doped p-region and said heavily doped n-layer, as a blocking voltage applied to said first and second connection electrodes increases;

wherein said lightly doped p-region is implemented as a p-well around said heavily doped p-region;

wherein said p-well is surrounded by said lightly doped n-region; and wherein said lightly doped n-region is surrounded by a buried heavily doped n-layer.

2. The ESD protection device of claim 1, wherein a heavily doped n-region is provided in said lightly doped p-region between said lightly doped n-region and said heavily doped p-region, said heavily doped n-region being connected to said heavily doped p-region via said second connection electrode.

3. An ESD protection device for an integrated circuit which is integrated in a semiconductor substrate of said integrated circuit, comprising:

a heavily doped n-region provided with a first connection electrode;

a heavily doped p-region provided with a second connection electrode;

a lightly doped n-region bordering on said heavily doped n-region; and a lightly doped p-region bordering on said heavily doped p-region and said lightly doped n-region and having a first portion and a second portion; and a heavily doped p-layer;

wherein said heavily doped p-region, said first portion of said lightly doped p-region and said lightly doped n-region form a lateral sequence of differently doped semiconductor regions adjacent a surface of said substrate;

wherein said lightly doped n-region, said second portion of said lightly doped p-region and said heavily doped p-layer form a vertical sequence of differently doped semiconductor regions;

wherein a lateral distance which exists between said lightly doped n-region and said heavily doped p-region and which is determined by said first portion of said lightly doped p-region is adjusted to be less than a distance which exists between said lightly doped n-region and said heavily doped p-layer and which is determined by said second portion of said lightly doped p-region such that a lateral breakthrough occurs between said lightly doped n-region and said heavily doped p-region before a vertical breakthrough occurs between said lightly doped n-region and said heavily doped p-layer, as a blocking voltage applied to said connection electrodes increases;

wherein said lightly doped n-region is implemented as an n-well around said heavily doped n-region;

wherein said n-well is surrounded by said lightly doped p-region; and wherein said lightly doped p-region is surrounded by a buried heavily doped p-layer.

4. The ESD protection device of claim 3, wherein a heavily doped p-region is provided in said lightly doped n-region between said lightly doped p-region and said heavily doped n-region, said heavily doped p-region being connected to said heavily doped n-region via said second connection electrode.

* * * * *

UNITED STATES PATENT AND TRADEMARK OFFICE
CERTIFICATE OF CORRECTION

| | | |
|---|---|---|
| PATENT NO. | : 6,713,816 B1 | Page 1 of 1 |
| APPLICATION NO. | : 09/529942 | |
| DATED | : March 30, 2004 | |
| INVENTOR(S) | : Wolf et al. | |

It is certified that error appears in the above-identified patent and that said Letters Patent is hereby corrected as shown below:

Column 4, Claim 1, lines 30 and 31, replace: "wherein said p-well is surrounded by said lightly doped n-region; and"

replace with -- said p-well being surrounded by said lightly doped n-region; and --

Column 4, Claim 1, lines 32 and 33, replace: "wherein said lightly doped n-region is surrounded by a buried heavily doped n-layer".

replace with -- said lightly doped n-region being partially surrounded by siad heavily doped n-layer --.

Column 6, Claim 1, lines 1 and 2, replace: "wherein said n-well is surrounded by said lightly doped p-region; and replace with: --said n-well being surrounded by said lightly doped p-region; and--

Column 6, Claim 1, lines 3 and 4, replace: "wherein said lightly doped p-region is surrounded by a buried heavily doped p-layer.

replace with: --said lightly doped p-region heing partially surrounded by said heavily doped p-layer--.

Signed and Sealed this

Ninth Day of January, 2007

JON W. DUDAS
*Director of the United States Patent and Trademark Office*

UNITED STATES PATENT AND TRADEMARK OFFICE
CERTIFICATE OF CORRECTION

PATENT NO. : 6,713,816 B1 Page 1 of 1
APPLICATION NO. : 09/529942
DATED : March 30, 2004
INVENTOR(S) : Wolf et al.

It is certified that error appears in the above-identified patent and that said Letters Patent is hereby corrected as shown below:

Title Page, Item (73) Assignee, replace "Fraunhofer-Gesellschaft zur Forderung der Angewandten Forschung E.V."
 with -- Fraunhofer-Gesellschaft zur Forderung der Angewandten Forschung E.V., and Robert Bosch GmbH --

Title Page, Item (30) Foreign Application Priority Data, replace "(DE) 197 45 410"

with -- (DE) 197 46 410 --

Signed and Sealed this

Thirty-first Day of July, 2007

JON W. DUDAS
*Director of the United States Patent and Trademark Office*